United States Patent
Aiello

(10) Patent No.: US 7,346,136 B1
(45) Date of Patent: Mar. 18, 2008

(54) RAKE RECEIVER

(75) Inventor: Roberto Aiello, San Diego, CA (US)

(73) Assignee: Staccato Communications, Inc., San Diego, CA (US)

( * ) Notice: Subject to any disclaimer, the term of this patent is extended or adjusted under 35 U.S.C. 154(b) by 673 days.

(21) Appl. No.: 10/465,830

(22) Filed: Jun. 18, 2003

Related U.S. Application Data

(60) Provisional application No. 60/390,231, filed on Jun. 20, 2002.

(51) Int. Cl.
    *H03B 7/10* (2006.01)
(52) U.S. Cl. .................................................. 375/347
(58) Field of Classification Search ................ 375/347, 375/130, 316, 328, 324, 267; 455/260, 553.1; 332/167
    See application file for complete search history.

(56) References Cited

U.S. PATENT DOCUMENTS

| | | | |
|---|---|---|---|
| 4,675,880 A * | 6/1987 | Davarian .................... 375/261 |
| 5,694,417 A | 12/1997 | Andren et al. |
| 6,807,237 B1 * | 10/2004 | Yamaguchi et al. ......... 375/328 |
| 6,925,108 B1 | 8/2005 | Miller et al. |
| 7,016,654 B1 * | 3/2006 | Bugeja ........................ 455/73 |
| 7,035,341 B2 * | 4/2006 | Mohindra .................... 375/261 |
| 7,068,715 B2 * | 6/2006 | Hoctor et al. ............... 375/239 |
| 2002/0172298 A1 * | 11/2002 | Waffaoui et al. ............ 375/316 |
| 2003/0063025 A1 | 4/2003 | Lowe et al. |
| 2003/0161411 A1 | 8/2003 | McCorkle et al. |

* cited by examiner

*Primary Examiner*—Khai Tran
(74) *Attorney, Agent, or Firm*—Van Pelt, Yi & James LLP

(57) ABSTRACT

A receiver system and method are disclosed for processing multipath propagated signals and multiband signals. The receiver includes a zero-intermediate frequency converter for demodulating one of the plurality of multipath propagated signals to produce a demodulated signal; and a sampling module for sampling the demodulated signal.

16 Claims, 9 Drawing Sheets

RAKE RECEIVER

CROSS REFERENCE TO RELATED APPLICATIONS

This application claims priority to U.S. Provisional Patent Application No. 60/390,231 entitled HIGH SPEED UWB RECEIVER FOR RAKE AND SUBBANDS-BASED SYSTEMS filed Jun. 20, 2002 which is incorporated herein by reference for all purposes.

FIELD OF THE INVENTION

The present invention relates generally to communications systems. More specifically, an ultra-wideband system is disclosed.

BACKGROUND OF THE INVENTION

In a conventional wireless communication environment, a signal sent by a transmitter usually reflects off various objects in the environment, and takes several paths before reaching the receiver. This phenomenon, called multipath propagation, causes the same signal to arrive at the receiver at different times. The multipath propagated signals received tend to overlap and lead to inter-symbol interference (ISI) problems. The phase difference between the received signals may cause the signals to cancel each other, resulting in low power level and poor signal quality at the receiver.

The variation of received amplitude and phase is referred to as fading. Traditionally, receiver systems are designed to mitigate the fading problem by using diversity receivers that have several receiver paths, where the receiver circuitry selects among the receiver paths that provide the strongest received signal. Diversity receivers, while effective for reducing fading, are more expensive compared to receivers without diversity.

In some systems, such as an ultra-wideband (UWB) system, the fading problem is less pronounced due to the nature of the signal. UWB technology is used in wireless communication systems for transmitting and receiving data over a wide spectrum. A UWB signal is commonly treated as a short radio frequency (RF) signal. Since the signal is short (often on the order of a few nanoseconds), the multipath propagated signals received do not significantly overlap with each other. It would be useful to take advantage of this characteristic of the UWB system to design receivers that would capture more energy from the received signals. It would also be desirable to have receiver designs that are cheaper to implement, without using diversity receivers.

BRIEF DESCRIPTION OF THE DRAWINGS

The present invention will be readily understood by the following detailed description in conjunction with the accompanying drawings, wherein like reference numerals designate like structural elements, and in which.

DETAILED DESCRIPTION

It should be appreciated that the present invention can be implemented in numerous ways, including as a process, an apparatus, a system, or a computer readable medium such as a computer readable storage medium or a computer network wherein program instructions are sent over optical or electronic communication links. It should be noted that the order of the steps of disclosed processes may be altered within the scope of the invention.

A detailed description of one or more preferred embodiments of the invention is provided below along with accompanying figures that illustrate by way of example the principles of the invention. While the invention is described in connection with such embodiments, it should be understood that the invention is not limited to any embodiment. On the contrary, the scope of the invention is limited only by the appended claims and the invention encompasses numerous alternatives, modifications and equivalents. For the purpose of example, numerous specific details are set forth in the following description in order to provide a thorough understanding of the present invention. The present invention may be practiced according to the claims without some or all of these specific details. For the purpose of clarity, technical material that is known in the technical fields related to the invention has not been described in detail so that the present invention is not unnecessarily obscured.

An improved technique for receiving ultra-wideband and multiband signals is disclosed. The technique employs a rake receiver to process multipath propagated signals that do not have much overlap. In some embodiments, the receiver has a single receiver path. In some embodiments, the receiver employs a continuously operating oscillator and uses zero-intermediate frequency conversion for demodulating the UWB signal. In some embodiments, the receiver includes matched filters for selecting individual subbands. The receiver is trained to determine the phase offset of each of the multipath propagated signals relative to the original signal transmitted. The multipath propagated signals are combined to obtain higher signal energy.

Figure 1:
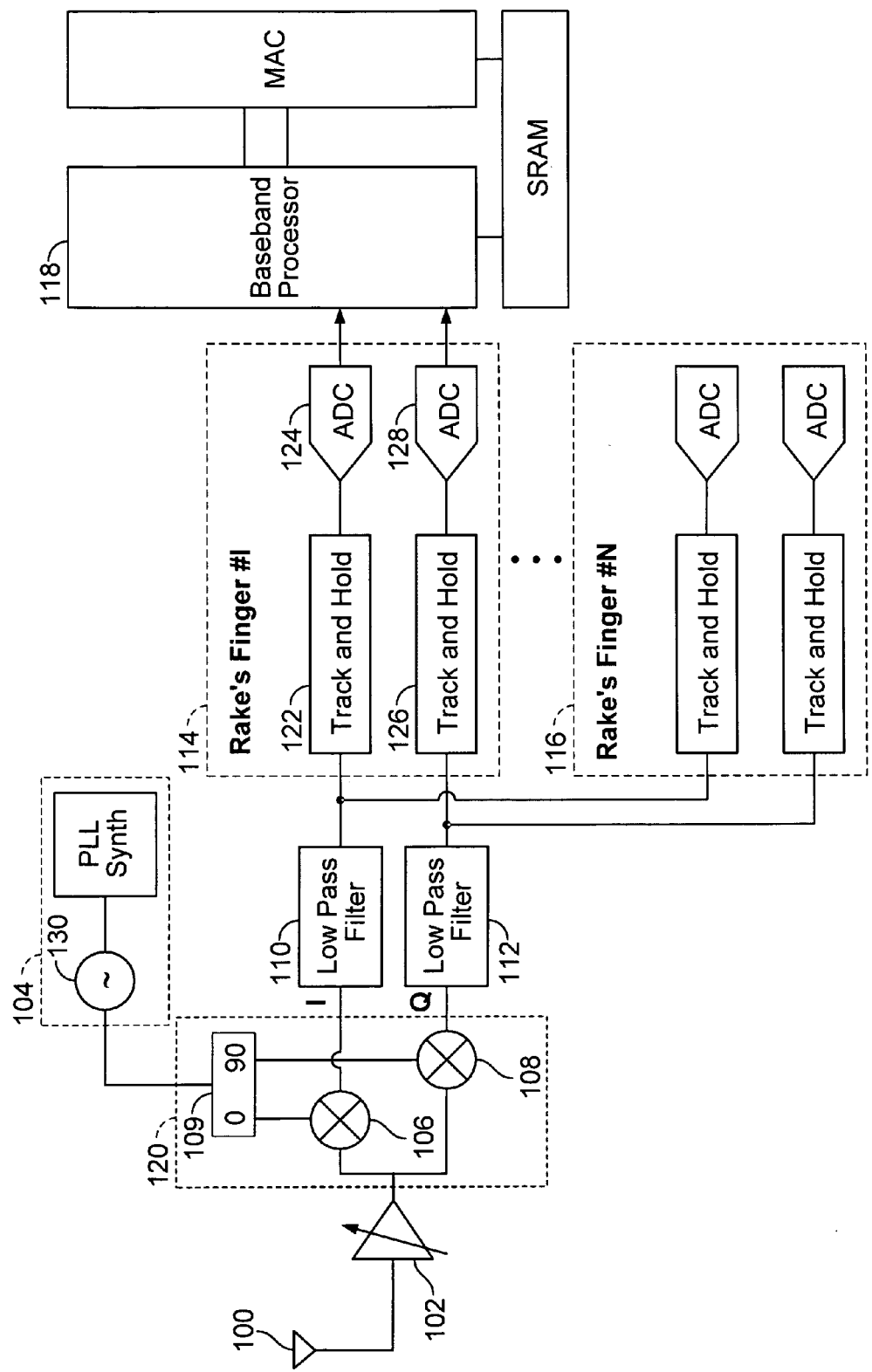
FIG. 1 is a block diagram illustrating a rake receiver embodiment.

FIG. 1 is a block diagram illustrating a rake receiver embodiment. In UWB systems, the multipath propagated signals tend to have little overlap due to the short duration of the signal; thus, the receiver design does not require a diversity receiver and can instead use a single analog receiver path. The signals are received by antenna 100, and amplified by amplifier 102.

Current UWB receivers have strict synchronization requirements because the received signal is discontinuous. In U.S. patent application Ser. No. 10/417,799 (by Aiello (filed Apr. 17, 2003) entitled: ULTRA-WIDEBAND TRANSCEIVER which is herein incorporated by reference for all purposes, Aiello disclosed a technique using zero-intermediate frequency (IF) conversion (also referred to as direct conversion) to relax the synchronization requirements of the UWB receiver. The receiver shown in FIG. 1 uses this technique. The circuit includes a zero-IF conversion module 120 for demodulating the UWB signal and converting it to a frequency shifted signal.

A frequency synthesizer 104 generates a reference signal having a frequency that is substantially the same as the carrier frequency used to modulate the UWB signal. Oscillator 130 of the frequency synthesizer is on continuously to provide a continuous reference signal. In some embodiments, the oscillator is only on during demodulation to conserve energy. The continuous reference signal is used by the zero-IF conversion module to convert the UWB signal to a baseband component and a higher frequency component. Phase shifter 109 is used to generate a phase-shifted version of the reference signal. In this embodiment, the phase shifter provides an additional signal that has a 90° phase shift relative to the reference signal.

The amplified signal is sent to mixer 106 and 108 of the zero-IF conversion module. The mixers multiply the UWB signal with the reference signal and its phase shifted counterpart, and output an I component and a Q component. Processing the signal using the I and Q channels relaxes the phase requirements at the receiver during synchronization, since the phase locked loop of the receiver is not required to provide phase adjustments as it would be if only one channel were used. The I component and the Q component are filtered by low pass filters 110 and 112, respectively, to obtain the baseband components. In this embodiment, the low pass filters are set to half the bandwidth of the carrier signal.

The filtered signals are sent to a rake module, which includes several sampling modules, also referred to as "fingers," such as modules 114 and 116. The sampling modules are used for sampling the demodulated signal and converting the signal to digital so that the signal can be further processed by the receiver's digital signal processor. Sampling module 114 has a branch used to process the I component and a branch used to process the Q component. The branch used to process the I component includes track-and-hold module 120 and analog-to-digital converter (ADC) 124, and the branch used to process the Q component includes track-and-hold module 126 and ADC 128. The track-and-hold module keeps its input signal at a steady value so that a slower ADC can be used to sample the input. The sampled signals are sent to baseband processor 118 to be further decoded. In some embodiments, the ADC's for the I and Q components are sufficiently fast for sampling the sequence of multipath propagated signals that they are shared across the sampling modules. Using shared high speed ADC's is sometimes more cost effective than using multiple slower ADC's.

The number of fingers in the rake receiver is implementation dependent. In some embodiments, the number of fingers corresponds to the number of received signals with sufficient energy to warrant using resources to process. In some embodiments, a fixed number of received signals may be processed based on an a priori determination of reasonable use of resources. Each finger of the rake is trained to sample its input at the appropriate time so that each of the received signals is captured. The receiver also learns the phase offsets of the received signals through the training process. To train the rake receiver, a sequence of signals with known phases is transmitted. Each finger of the rake receiver learns to detect one of the received signals at the appropriate time to capture its energy, and compares the detected phase with the known phase of the transmitted signal to determine the phase offset. The offsets are stored, and used later for combining the multipath propagated signals.

Figure 2:
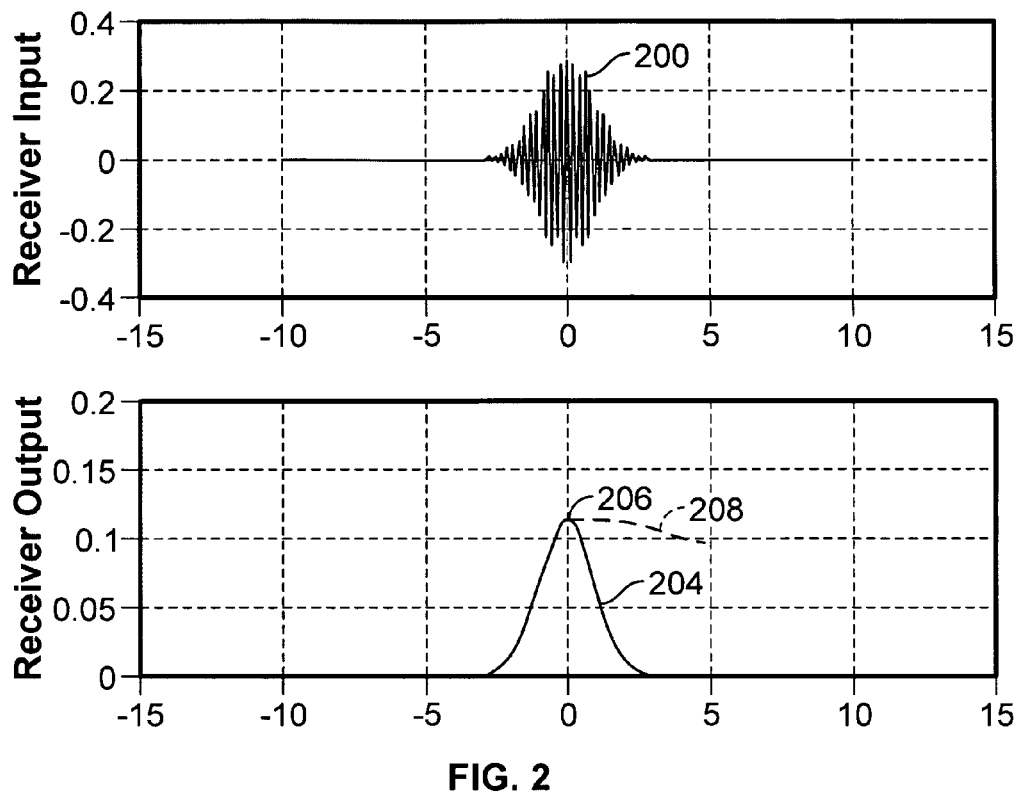
FIG. 2 shows time domain diagrams illustrating the processing of a signal by a sampling module shown in FIG. 1.

FIG. 2 shows time domain diagrams illustrating the processing of a signal by a sampling module shown in FIG. 1. Signal 200 is one of the multipath propagated signals (the other multipath propagated signals are not shown). Signal 204 is a filtered input to a track-and-hold module. The track-and-hold module samples the signal at 206 and keeps the value steady. The output of the track-and-hold module, signal 208, is shown in dash. The ADC converts signal 208 from analog to digital. By using a track-and-hold module, the ADC is able to sample signal 208 instead of signal 204 at its peak. Thus, the timing requirement of the ADC is greatly reduced.

Figure 3:
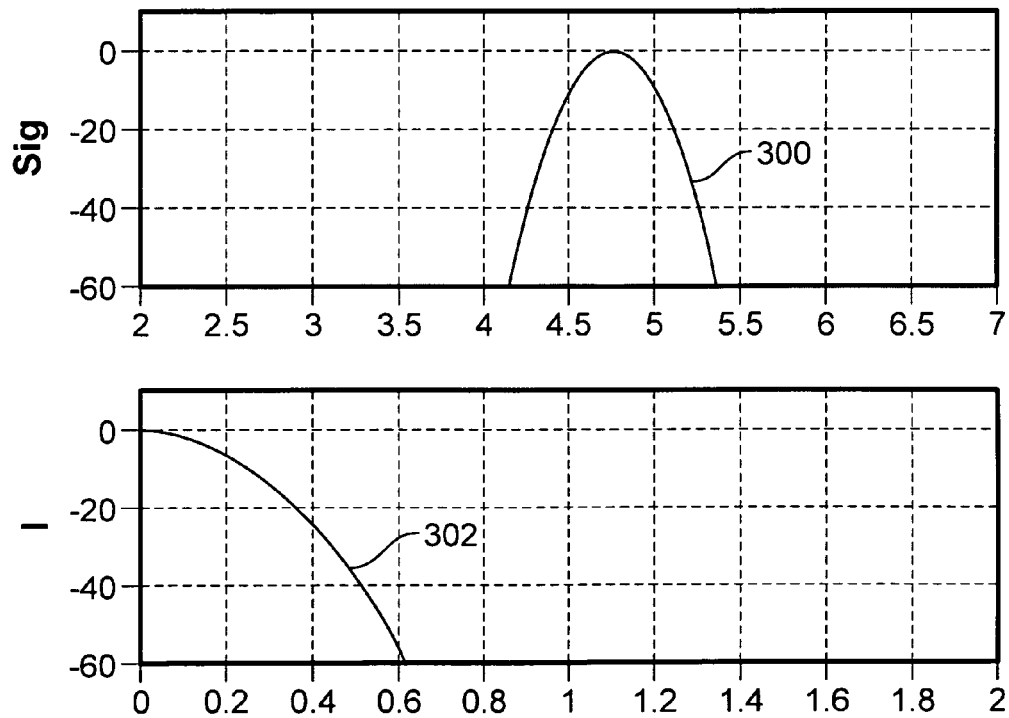
FIG. 3 shows frequency domain diagrams illustrating the spectrum of the received signal shown in FIG. 2.

FIG. 3 shows frequency domain diagrams illustrating the spectrum of the received signal shown in FIG. 2. Signal 300 illustrates the spectrum of a radio frequency (RF) signal received, and the signal 302 illustrates the demodulated signal that is converted to baseband. Converting the signal to baseband greatly reduces the speed requirement on the ADC. In this embodiment, the analog bandwidth of the track-and-hold module is set to approximately half the signal bandwidth to capture all the power shown in signal 302.

Figure 4:
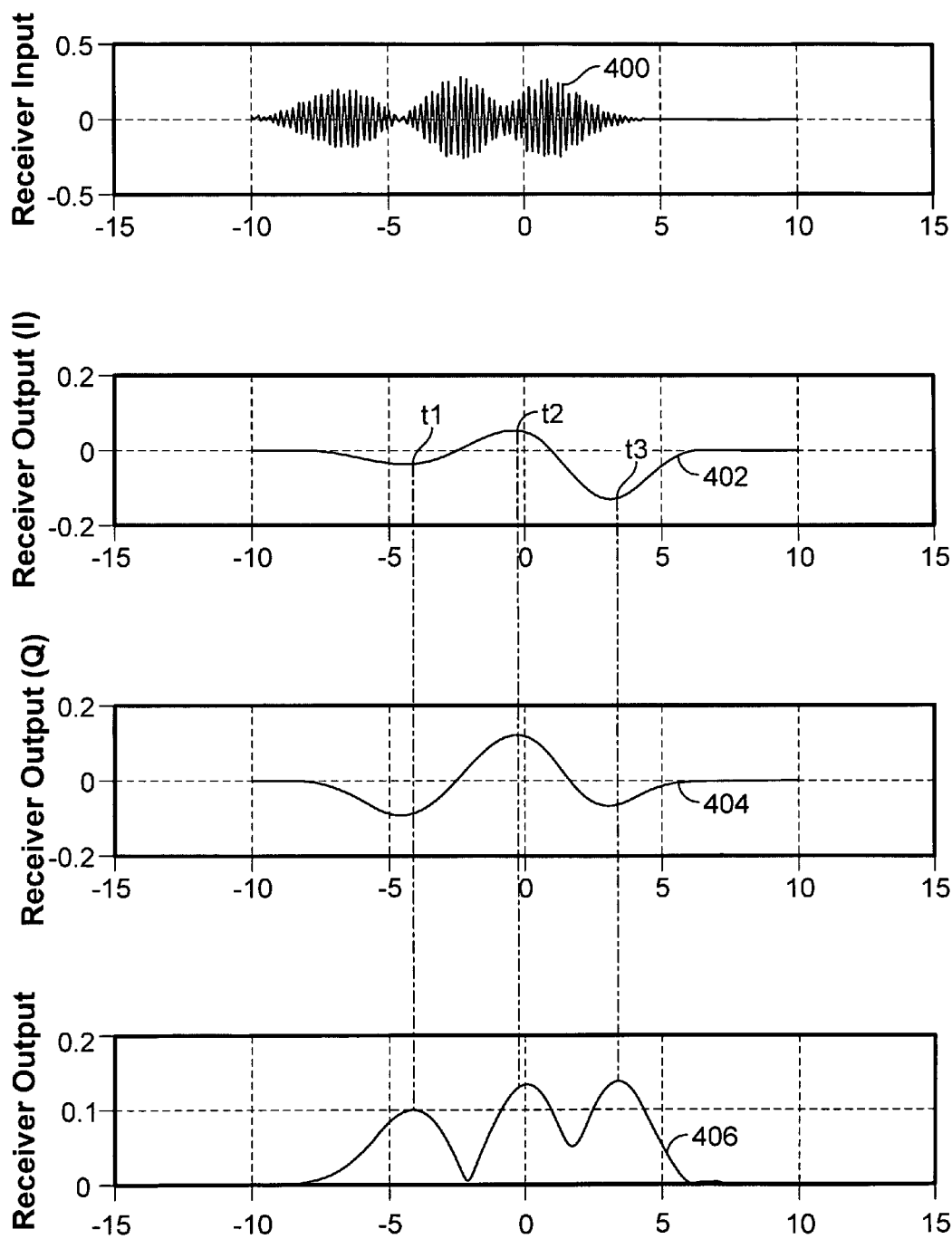
FIG. 4 shows time domain signal diagrams illustrating the processing of received signals according to a receiver embodiment.

FIG. 4 shows time domain signal diagrams illustrating the processing of received signals according to one receiver embodiment. Signal 400 is a combined signal formed by three multipath propagated signals. Because the signals are short, there is not much overlapping between two signals. Three fingers of the rake receiver are trained to sample the signal at times t1, t2, and t3. Signals 402 and 404 are the I and Q components of the filtered input to the rake module. Using the phase information obtained through the training process, the I and Q components are combined to form signal 406, which has higher signal energy.

In some systems, a wide carrier bandwidth is divided into subbands. Typically, the carrier bandwidth spans several gigahertz. The symbols are modulated using different carrier frequencies from different subbands and transmitted as short signals. The modulated symbols may be transmitted simultaneously or staggered in time. These systems are referred to as multiband systems. The rake receiver is also applicable for combining multipath propagated signals transmitted by multiband systems, especially if the transmitted signals are short signals that do not have much interference with each other.

Figure 5:
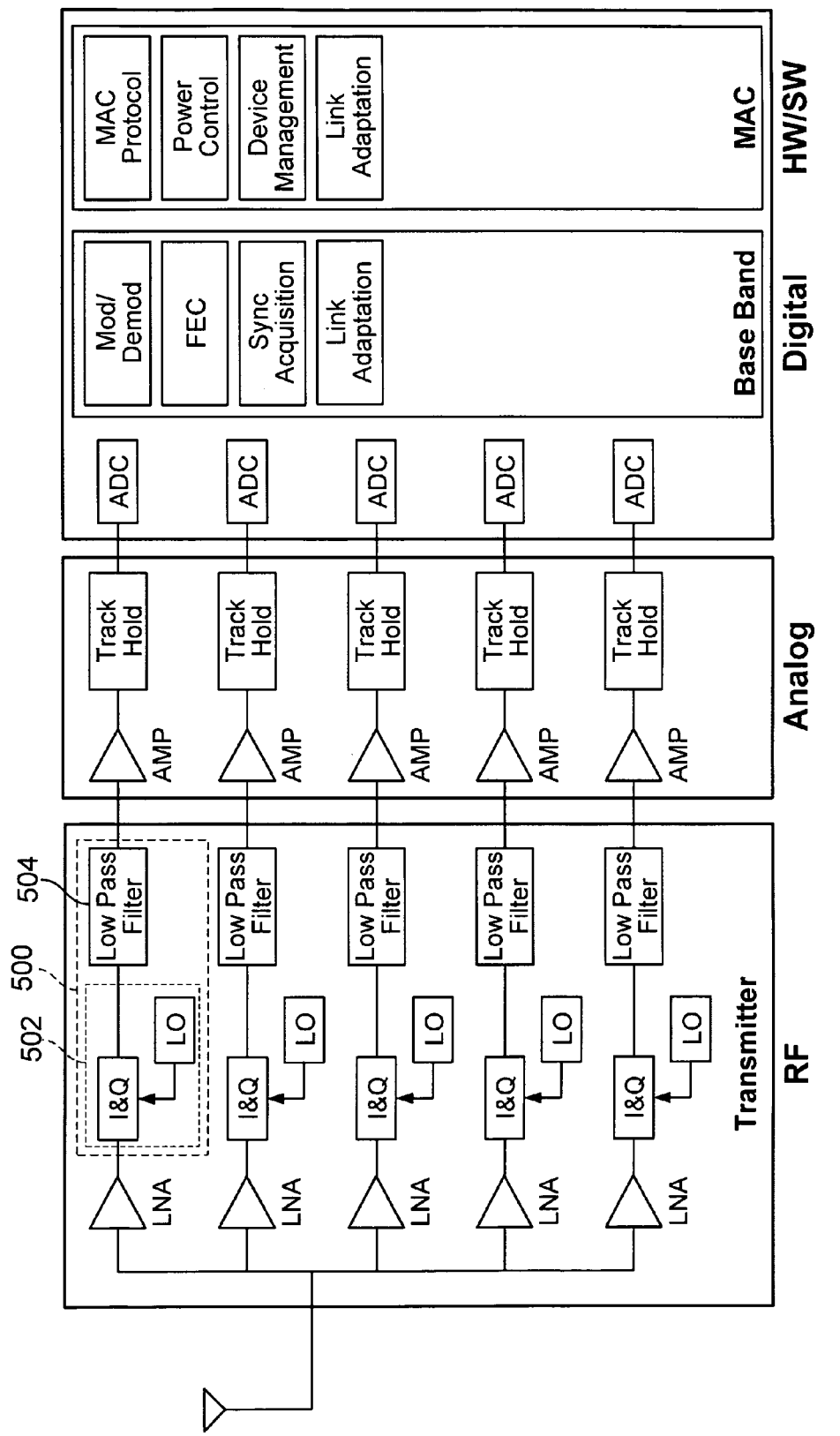
FIG. 5 is a block diagram illustrating a rake receiver embodiment for a multiband system.

FIG. 5 is a block diagram illustrating a rake receiver embodiment for a multiband system. The receiver includes a bank of matched filters for selecting individual subbands. Each matched filter includes a zero-IF conversion stage and a low pass filter. For example, matched filter 500 includes a zero-IF conversion stage 502 and a low pass filter 504. The zero-IF conversion stage demodulates the signal down to its baseband and the low pass filter rejects the sidebands. Together, they select the desired subband. Since the subband rejection to takes place in baseband, the low pass filter can be implemented as an inexpensive baseband filter, as opposed to the more expensive RF filter if the subband rejection took place in RF. The filter outputs are sent to the corresponding sampling module of the rake that is trained to sample the signal with a known phase offset. The rake outputs are then sent to baseband processor 506 to be further processed.

Although in the embodiment shown, the matched filter is connected to a single sampling module, it should be noted that some multiband receiver embodiments are designed to take advantage of the architecture shown in FIG. 1, where multiple sampling modules are used capture the energy in the multipath propagated signals.

Figure 6:
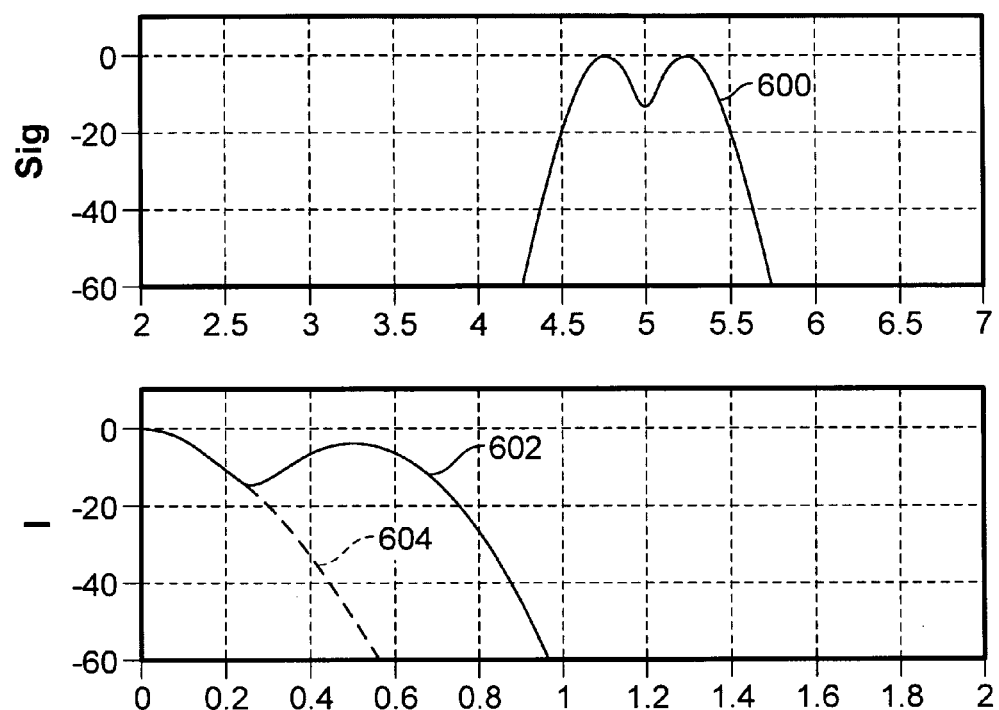
FIG. 6 shows frequency domain signal diagrams illustrating subband rejection according to a receiver embodiment.

FIG. 6 shows frequency domain signal diagrams illustrating subband rejection according to one receiver embodiment. Subband rejection is performed using a matched filter such as matched filter 500 shown in FIG. 5. Signal 600 is a combination of signals from two subbands. After zero-IF conversion, the signal is shifted down to baseband and is represented as signal 602. After the low pass filter is applied, the adjacent subband is rejected and only signal 604 of the selected subband remains.

Figure 7:
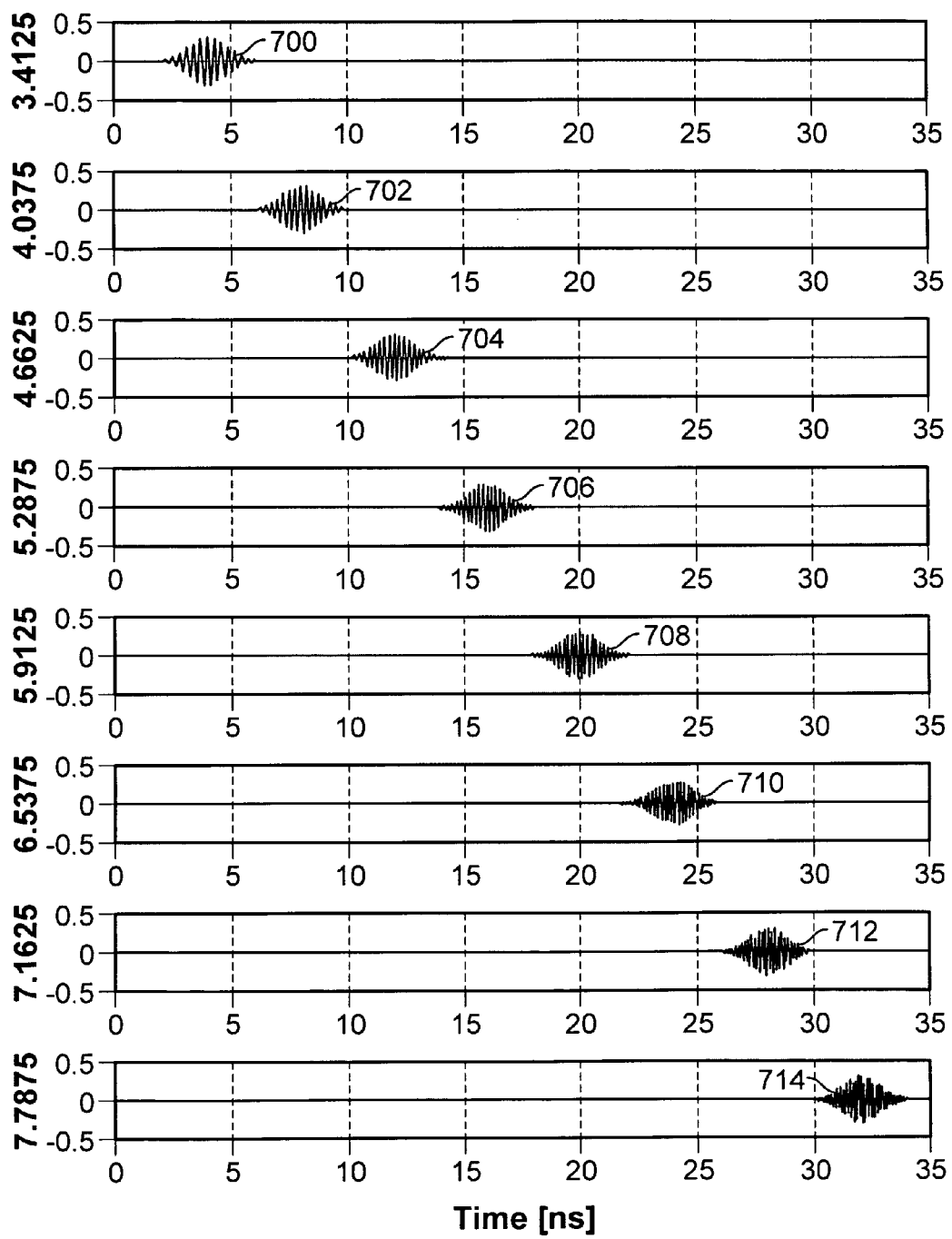
FIG. 7 shows time domain signal diagrams illustrating signals sent by one type of multiband system.

Rake receivers that perform sideband rejection are applicable for different types of multiband systems. FIG. 7 shows time domain signal diagrams illustrating signals sent by one type of multiband system. Signals 700-714 are each modulated using a different carrier frequency in a different subband. The signal transmission is staggered in time, where each signal is transmitted after the transmission of the previous signal has completed.

Figure 8:
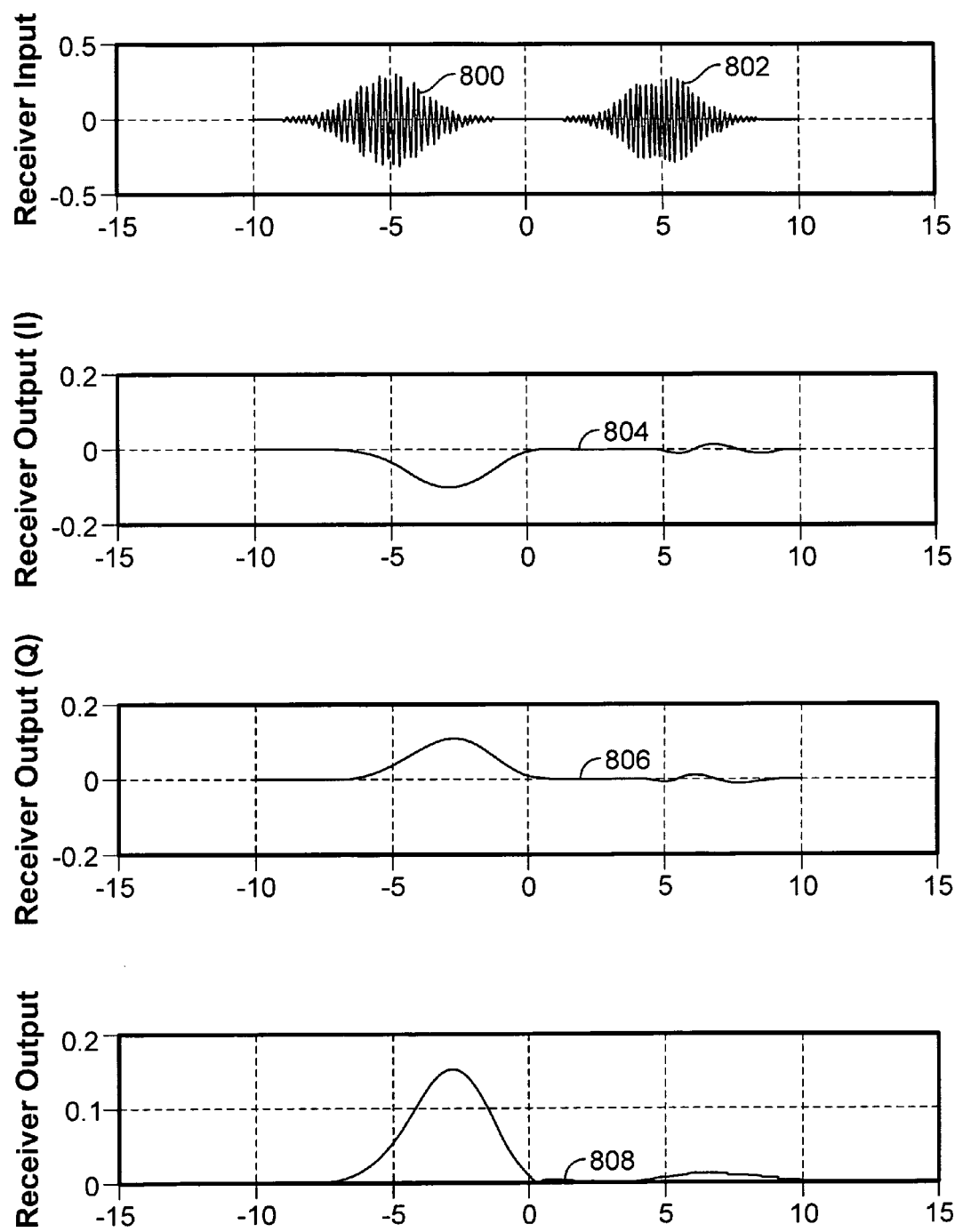
FIG. 8 shows time domain signal diagrams illustrating the processing of two signals transmitted by a multiband system similar to the one shown in FIG. 7.

FIG. 8 shows time domain signal diagrams illustrating the processing of two signals transmitted by a multiband system similar to the one shown in FIG. 7. Signals 800 and 802 are modulated using subband carrier frequencies. Signal 802 is transmitted after signal 800 is transmitted. Signal 804 and 806 correspond to the I and Q components of the results from a matched filter that selects the carrier frequency used to modulate signal 800 and rejects other subbands. The resulting combined signal is shown as signal 808.

Figure 9:
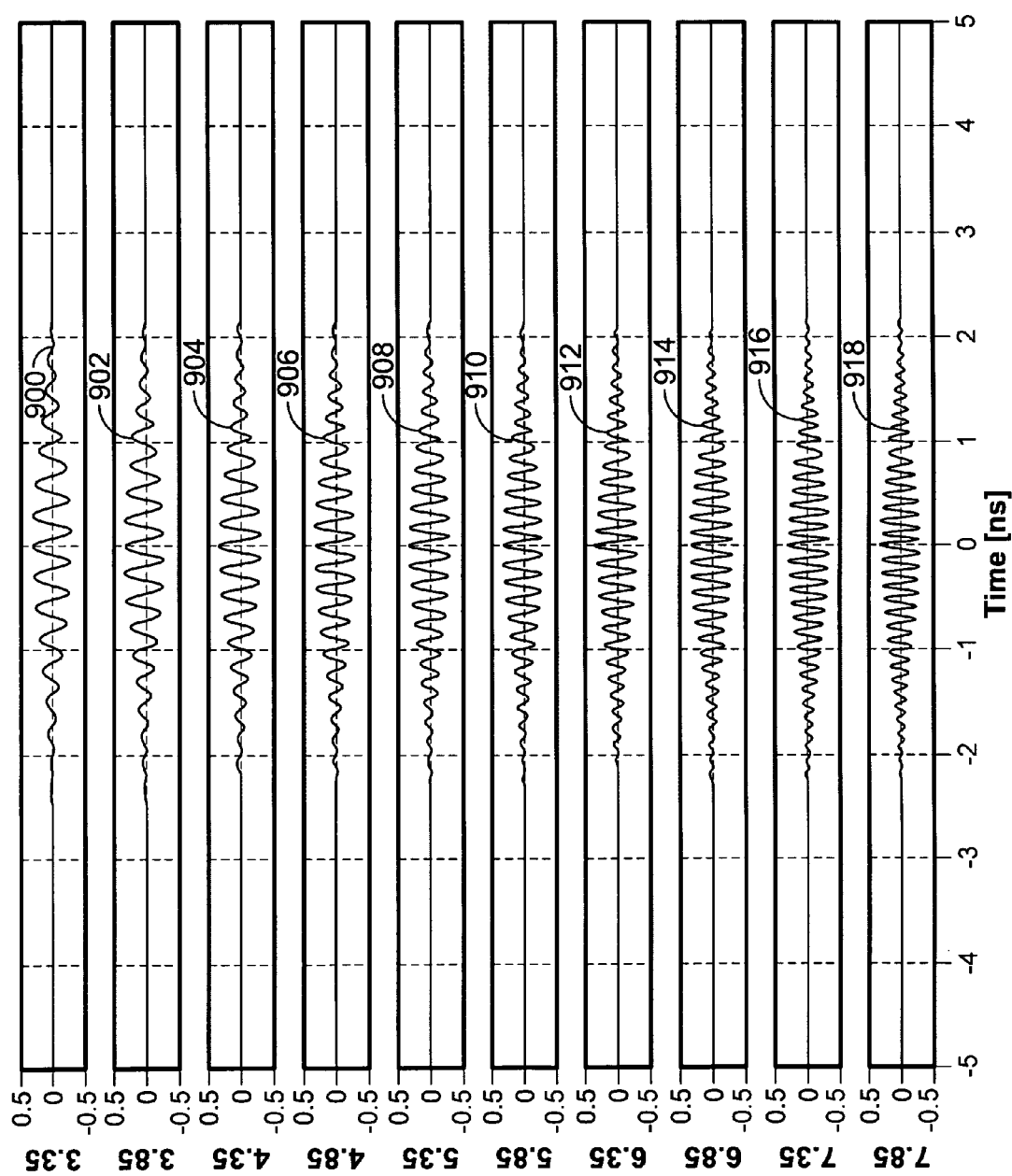
FIG. 9 shows signal diagrams illustrating signals transmitted in another type of multiband system.

FIG. 9 shows signal diagrams illustrating signals transmitted in another type of multiband system. Signals 900-918 are each modulated using a different carrier frequency in a different subband. The signals are transmitted simultaneously.

Figure 10:
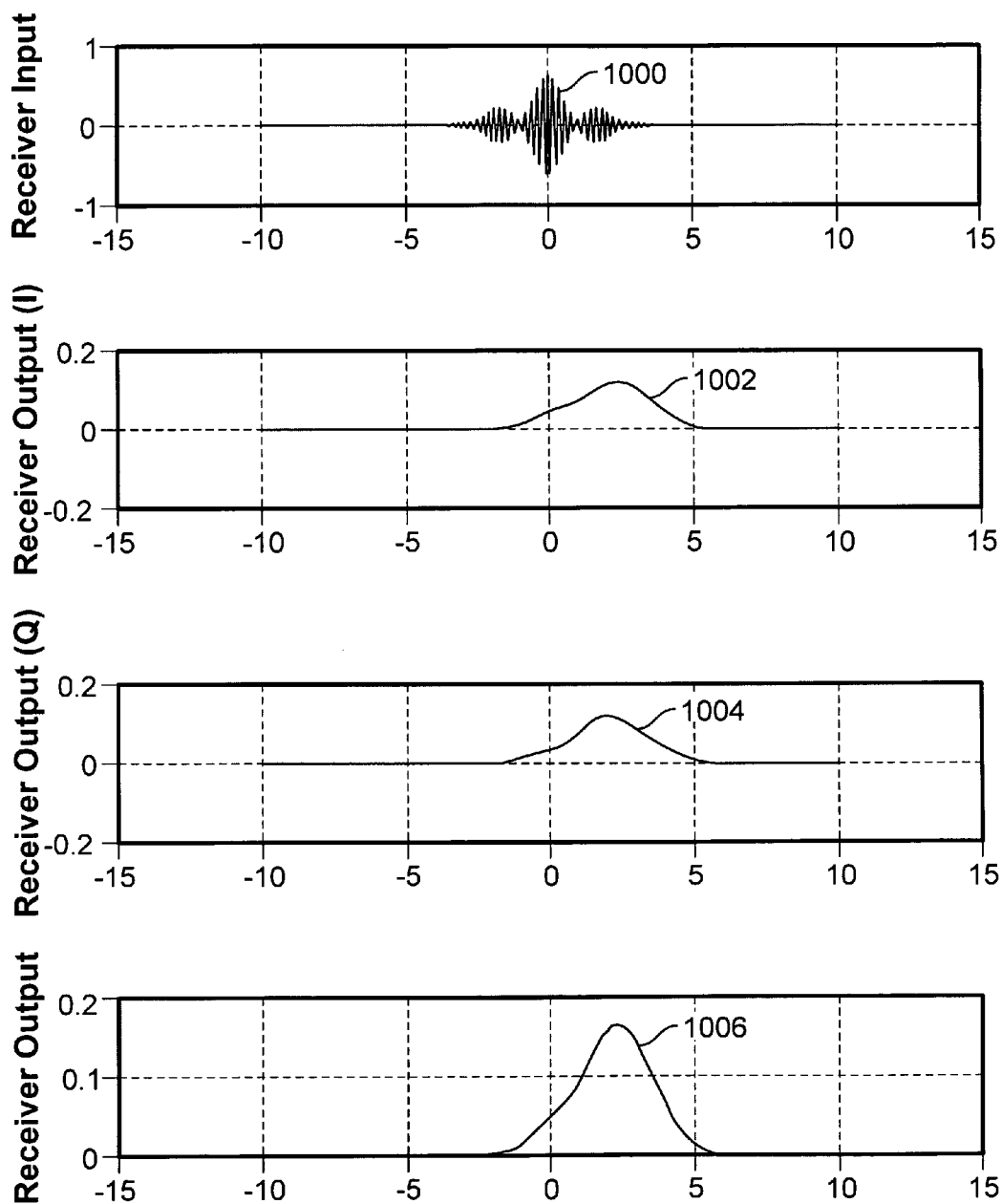
FIG. 10 shows time domain diagrams illustrating the processing of subband signals transmitted by a multiband system similar to the one shown in FIG. 9.

FIG. 10 shows time domain diagrams illustrating the processing of subband signals transmitted by a multiband system similar to the one shown in FIG. 9. Signal 1000 is formed by two simultaneously transmitted signals modulated with different subband carrier frequencies. Signals 1002 and 1004 correspond to the I and Q components of the results from a matched filter that selects one of the carrier frequencies and rejects the rest. The combined output signal is 1006.

An improved technique for receiving ultra-wideband and multiband signals has been disclosed. The technique takes advantage of the multipath propagation characteristics of UWB signals, and uses a rake receiver to obtain higher signal energy without resorting to diversity receivers. In multiband systems, the rake receiver is used to reject sidebands. The resulting receiver design is more effective and less expensive.

Although the foregoing invention has been described in some detail for purposes of clarity of understanding, it will be apparent that certain changes and modifications may be practiced within the scope of the appended claims. It should be noted that there are many alternative ways of implementing both the process and apparatus of the present invention. Accordingly, the present embodiments are to be considered as illustrative and not restrictive, and the invention is not to be limited to the details given herein, but may be modified within the scope and equivalents of the appended claims.

What is claimed is:

1. A receiver for processing a plurality of multipath propagated signals, comprising:
    a receiver configured to receive at least one of the plurality of multipath propagated signals, wherein the plurality of multipath propagated signals are associated with an ultra-wideband signal;
    a zero-intermediate frequency converter for demodulating at least one of the plurality of multipath propagated signals to produce a demodulated signal;
    a first sampling module for sampling a first sampling input signal that is associated with (1) the demodulated signal and (2) a first one of the plurality of multipath propagated signals; and
    a second sampling module for sampling a second sampling input signal that is associated with (1) the demodulated signal and (2) a second one of the plurality of multipath propagated signals.

2. A receiver for processing a plurality of multipath propagated signals as recited in claim 1, wherein the zero-intermediate frequency converter includes a mixer for mixing the at least one of the plurality of multipath propagated signals with a reference signal.

3. A receiver for processing a plurality of multipath propagated signals as recited in claim 1, further including a frequency synthesizer for generating a reference signal, wherein the zero-intermediate frequency converter includes a mixer for mixing the at least one of the plurality of multipath propagated signals with the reference signal.

4. A receiver for processing a plurality of multipath propagated signals as recited in claim 1, wherein the zero-intermediate frequency converter includes a first mixer for mixing the at least one of the plurality of multipath propagated signals with a first reference signal and a second mixer for mixing the at least one of the plurality of multipath propagated signals with a second reference signal having a phase shift relative to the first reference signal.

5. A receiver for processing a plurality of multipath propagated signals as recited in claim 1, wherein the zero-intermediate frequency converter includes a first mixer for mixing the at least one of the plurality of multipath propagated signal with a first reference signal to obtain an I component; and a second mixer for mixing the at least one of the plurality of multipath propagated signal with a second reference signal having a 90° phase shift relative to the first reference signal to obtain a Q component.

6. A receiver for processing a plurality of multipath propagated signals as recited in claim 1, wherein the plurality of multipath propagated signals includes multiband signals.

7. A receiver for processing a plurality of multipath propagated signals as recited in claim 1, wherein the sampling module includes a track-and-hold module and a analog-to-digital converter for digitizing the output of the track-and-hold module.

8. A receiver for processing a plurality of multipath propagated signals as recited in claim 1, further including a baseband processor for processing the output of the sampling module.

9. A method for processing a plurality of multipath propagated signals comprising:
    receiving at least one of the plurality of multipath propagated signals, wherein the plurality of multipath propagated signals are associated with an ultra-wideband signal;
    demodulating at least one of the plurality of multipath propagated signals using zero-intermediate frequency conversion to produce a demodulated signal;
    sampling a first sampling input signal that is associated with (1) the demodulated signal and (2) a first one of the plurality of multipath propagated signals; and sampling a second sampling input signal that is associated with (1) the demodulated signal and (2) a second one of the plurality of multipath propagated signals.

10. A method for processing a plurality of multipath propagated signals as recited in claim 9, wherein sampling includes sampling a plurality of demodulated signals to produce a plurality of sampled signals and the method further comprises combining the plurality of sampled signals.

11. A method for processing a plurality of multipath propagated signals as recited in claim 9, wherein the plurality of multipath propagated signals includes multiband signals.

12. A method for processing a plurality of multipath propagated signals as recited in claim 9, further comprising selecting a subband.

13. A method for processing a plurality of multipath propagated signals as recited in claim 9, further comprising selecting a subband using a matched filter.

14. A method for processing a plurality of multipath propagated signals as recited in claim 9, wherein demodulating includes generating a continuous reference signal using a local oscillator.

15. A method for processing a plurality of multipath propagated signals as recited in claim 9, wherein demodulating includes mixing the multipath propagated signals with a reference signal.

16. A method for processing a plurality of multipath propagated signals as recited in claim 9, wherein demodulating includes mixing the multipath propagated signals with a reference signal and a phase shifted version of the reference signal.

* * * * *